United States Patent
Xu et al.

(10) Patent No.: US 9,994,110 B2
(45) Date of Patent: Jun. 12, 2018

(54) DUAL GATE SOLID STATE DEVICES TO REDUCE SWITCHING LOSS

(71) Applicant: Ford Global Technologies, LLC, Dearborn, MI (US)

(72) Inventors: Zhuxian Xu, Novi, MI (US); Chingchi Chen, Ann Arbor, MI (US); Michael W. Degner, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days. days.

(21) Appl. No.: 15/251,231

(22) Filed: Aug. 30, 2016

(65) Prior Publication Data

US 2018/0056795 A1 Mar. 1, 2018

(51) Int. Cl.
| | |
|---|---|
| *H02M 1/088* | (2006.01) |
| *H02M 1/32* | (2007.01) |
| *B60L 11/18* | (2006.01) |
| *H03K 17/567* | (2006.01) |
| *H02P 27/08* | (2006.01) |
| *H02M 1/00* | (2006.01) |

(52) U.S. Cl.
CPC ......... *B60L 11/1803* (2013.01); *H02M 1/088* (2013.01); *H02P 27/08* (2013.01); *H03K 17/567* (2013.01); *H02M 2001/0054* (2013.01)

(58) Field of Classification Search
CPC ......... H03K 17/567; H03K 2017/6878; H03K 3/35; H03K 2005/00221; H03K 17/00; H03K 19/09414; H02P 27/04; H02P 2201/00; H02M 1/088; H02M 1/4233; H02M 2001/0058; H02M 7/162; B60L 11/1803; B60L 3/003
See application file for complete search history.

(56) References Cited

U.S. PATENT DOCUMENTS

| | | | | |
|---|---|---|---|---|
| 5,731,970 | A * | 3/1998 | Mori ................... | H01L 23/04 257/E23.14 |
| 8,860,494 | B2 * | 10/2014 | Mazzola ............... | H02M 1/08 327/423 |
| 9,639,106 | B2 * | 5/2017 | Gazit ................... | G05F 3/08 |
| 9,774,244 | B2 * | 9/2017 | Cyr ..................... | H02M 1/32 |

(Continued)

FOREIGN PATENT DOCUMENTS

WO 2015070344 A1 5/2015

OTHER PUBLICATIONS

Kelvin Emitter Configuration Further Improves Switching Performance of TRENCHSTOP 5 IGBTs : PowerGuru, Dec. 4, 2014, Infineon Technologies AG, 4 pages.

(Continued)

*Primary Examiner* — Bentsu Ro
*Assistant Examiner* — Said Bouziane
(74) *Attorney, Agent, or Firm* — David B. Kelley; Brooks Kushman P.C.

(57) ABSTRACT

A vehicle includes an electric machine that provides propulsive force to the vehicle, and a power inverter that supplies power from a traction battery to the electric machine using a first and second switch configured as a half-bridge. The first switch has a first gate, a first gate lead coupled with the first gate and having a first inductance, and a second gate lead coupled with the first gate and having a second inductance greater than the first inductance.

6 Claims, 7 Drawing Sheets

(56) References Cited

U.S. PATENT DOCUMENTS

| | | | | |
|---|---|---|---|---|
| 2007/0115705 | A1* | 5/2007 | Gotzenberger | H03K 17/08122 363/132 |
| 2015/0207429 | A1 | 7/2015 | Akiyama | |
| 2015/0236686 | A1* | 8/2015 | Senda | H03K 17/0828 327/381 |
| 2016/0301308 | A1* | 10/2016 | Amar | H03K 17/0828 |
| 2016/0352331 | A1* | 12/2016 | Wang | H03K 17/687 |

OTHER PUBLICATIONS www.mitsubishichips.eu; www.mitsubishi.com; semis.info@mcg.mec.com, Power Devices, Selection Guide 2009, Mitsubishi Electric Environmental Vision 2021, 80 pages.

* cited by examiner

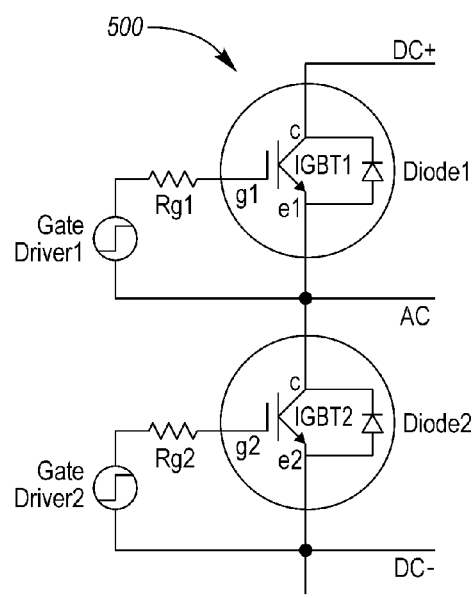
FIG. 5A
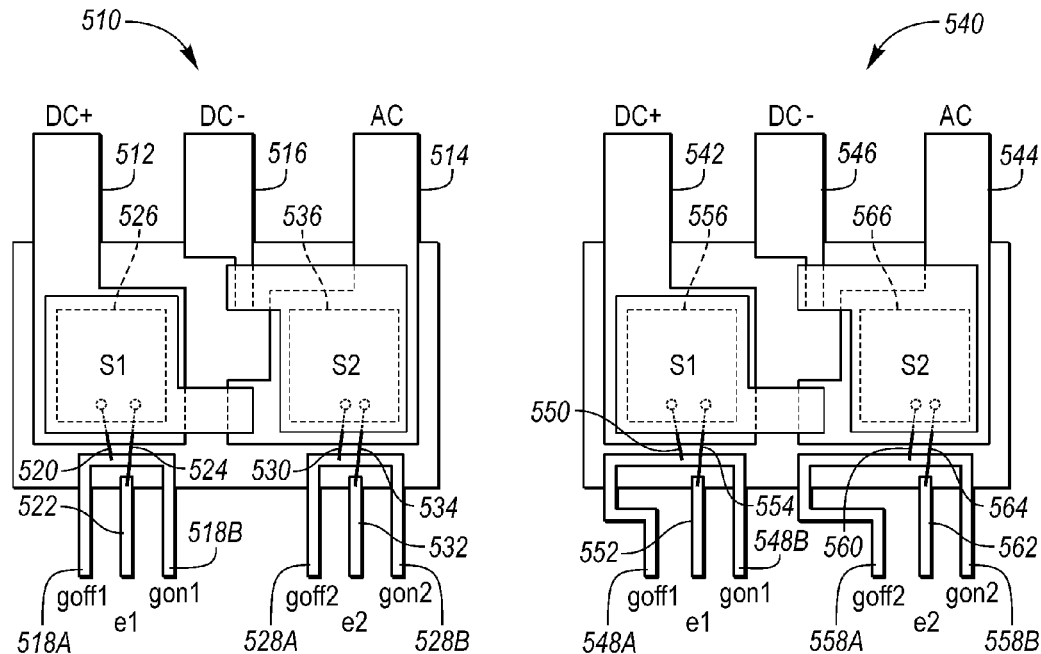
FIG. 5B  FIG. 5C

DUAL GATE SOLID STATE DEVICES TO REDUCE SWITCHING LOSS

TECHNICAL FIELD

This application is generally related to a solid state switch having multiple gate leads in which each gate is inductively coupled with an inductance in the power loop.

BACKGROUND

Electrified vehicles including hybrid-electric vehicles (HEVs) and battery electric vehicles (BEVs) rely on a traction battery to provide power to a traction motor for propulsion and a power inverter therebetween to convert direct current (DC) power to alternating current (AC) power. The typical AC traction motor is a 3-phase motor that may be powered by 3 sinusoidal signals each driven with 120 degrees phase separation. The traction battery is configured to operate in a particular voltage range and provide a maximum current. The traction battery is alternatively referred to as a high-voltage battery wherein a terminal voltage of a typical traction battery is over 100 Volts DC. However, improved performance of electric machines may be achieved by operating in a different voltage range, typically at voltages greater than the traction battery terminal voltage. Likewise, the current requirements to drive a vehicular electric machine are commonly referred to as high current in which the current may exceed 600 Amps in operation. Often the impact of parasitic inductances of a switch, such as a solid state switch or a power module, used to toggle the voltage and current may result in inductive coupling between the power lead and the control lead. This inductive coupling may provide delayed transitions and switching losses.

Many electrified vehicles include a DC-DC converter, also referred to as a variable voltage converter (VVC), to convert the voltage of the traction battery to an operational voltage level of the electric machine. The electric machine, that may include a traction motor, may require a high voltage and high current. Due to the voltage, current and switching requirements, a solid state switch such as an Insulated Gate Bipolar junction Transistor (IGBT) is typically used to generate the signals in the power inverter and the VVC.

SUMMARY

A power module includes a first solid state switch having a first gate, a first gate lead coupled with the first gate and having a first inductance, and a second gate lead coupled with the first gate and having a second inductance greater than the first inductance.

A vehicle includes an electric machine configured to provide propulsive force to the vehicle, and a power inverter configured to supply power from a traction battery to the electric machine using a first and second switch configured as a half-bridge. The first switch has a first gate, a first gate lead coupled with the first gate and having a first inductance, and a second gate lead coupled with the first gate and having a second inductance greater than the first inductance.

A power switching component includes a monolithic IGBT die having an emitter, a substrate supporting the die, and a power emitter lead supported by the substrate. The component further includes a first Kelvin emitter lead supported by the substrate and inductively coupled with the emitter via a first inductance, and a second Kelvin emitter lead supported by the substrate, inductively coupled with the emitter, and having a second inductance greater than the first inductance.

BRIEF DESCRIPTION OF THE DRAWINGS

FIG. 5A is a schematic diagram of a typical phase leg of the inverter of FIG. 3 used to drive an electric machine.

FIG. 5B is an illustration of a plan layout of a typical phase leg with dual IGBTs each having dual gate terminals.

FIG. 5C is an illustration of a plan layout of a typical phase leg with dual IGBTs each having dual asymmetric lead length gate terminals.

DETAILED DESCRIPTION

Figure 1:
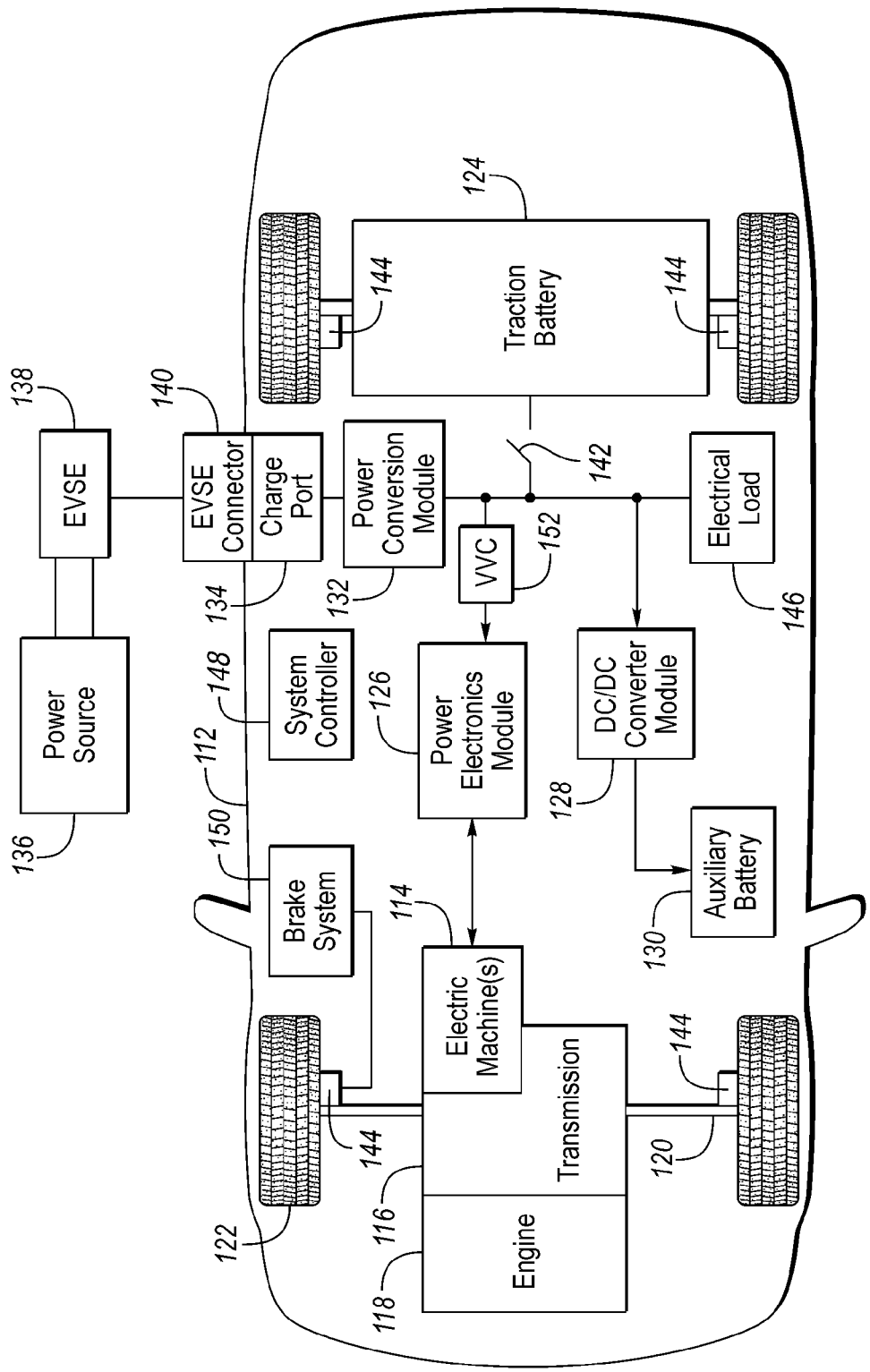
FIG. 1 is a diagram of a hybrid vehicle illustrating typical drivetrain and energy storage components with a variable voltage converter and power inverter therebetween.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Solid state devices (SSD), such as Insulated Gate Bipolar junction Transistors (IGBTs), Metal Oxide Semiconductor Field Effect Transistors (MOSFETs), or Bipolar Junction Transistors (BJTs) are widely used in a variety of industrial applications, such as electric motor drives, power inverters, and power modules. Operation of an IGBT and a MOSFET is voltage controlled, in which the operation is based on a voltage applied to a gate of the IGBT or MOSFET, while operation of a BJT is current controlled, in which the operation is based on a current applied to a base of the BJT. Here, the use of an IGBT will be discussed, however the structure and methods are applicable to other SSDs. Operation of an IGBT is controlled by a gate voltage supplied by a gate driver. Conventional gate drivers are typically based on a voltage, greater than a threshold voltage, applied to the IGBT gate with a current limiting resistor, which typically consists of a switchable voltage source and a gate resistor. A low gate resistance would lead to a fast switching speed and low switching loss, but may also cause higher stresses on the semiconductor devices, e.g. over-voltage stresses. Therefore, the gate resistance is selected to seek a compromise between switching loss, switching delay, and stresses. When turning off an IGBT, the gate resistor reduces the current flowing from the gate and thereby increases a shutoff time of the IGBT. Also, the IGBT may not have equal losses during turn-on and turn-off, therefore the use of a gate driver that provides a turn-on resistance that is different from the turn-off resistance.

Another factor to consider with respect to switching losses of a solid state device is a common source inductance. Common source inductance is an inductance shared by a main power loop and a gate driver loop in a switching circuit of a MOSFET circuit. For a MOSFET circuit, the source pin is common in both the power loop (a high voltage and high current flow path from the drain to source $I_{ds}$ which is used to provide power to a load) and the control loop (a low voltage and low current flow path across the gate and source $V_{gs}$ which is used to control the flow power to the load). Here, the term and principles are applied to an IGBT, in which the emitter pin is common in both the power loop (current flowing from the collector to emitter $I_c$) and the control loop (voltage across the gate and emitter $V_{ge}$), there the term common source inductance will be used to refer to common emitter inductance. Common source inductance is typically a parasitic inductance associated with device packaging and PCB traces. Common source inductance may deteriorate the turn-on switching performance by reducing the switching speed and increasing switching losses that leads to gate ringing, which then may cause gate oxide breakdown or control instability.

Here, the use of dual gate control path loops for turn-on and turn-off, this includes a dual Kelvin emitter device and a dual gate lead device. Although mainly discussed using a dual gate lead device, the concepts are applicable to dual Kelvin emitter devices. A dual gate lead device provides an improvement to switching performance and loss reduction by the configuration of dual common source inductances. A control terminal is configured to have a distinct common source inductance tuned for turn on, and a distinct common source inductance for turn off. The use of independent common source inductances for turn on and turn off allows the device or module designer to tune the device such that the inductive voltage overshoot is reduced and via the of a lower gate resistance. The use of a lower gate resistor results in increased switching speeds and reduced losses.

An SSD packaged with multiple gate leads, also referred to as gate terminals, may be configured with different inductances associated with each gate lead. The multiple gate terminal structure may include two or more gate leads. For example, a two gate terminal device may be configured to have different coupling coefficient between each gate terminal and the main power loop, thus creating dedicated common source inductances for turn-on and turn-off of the device. The coupling coefficient may be a positive number, a negative number, or zero. The power loop inductance includes all the parasitic inductances in the power loop, (e.g. inductance at the emitter side or collector side, inductance of upper or lower devices, capacitor ESL, bus-bar inductances, etc). These multiple gate terminal packaged devices may be used in and tuned for many application including automotive inverters and automotive DC-DC converters.

The coupling coefficient, e.g. a coupling inductance, value is based on a gate resistance, an input capacitance of the IGBT between the gate and emitter of the IGBT with a collector of the IGBT shorted to the emitter, the DC bus voltage, the load current, and the power loop stray inductance.

FIG. 1 depicts an electrified vehicle 112 that may be referred to as a plug-in hybrid-electric vehicle (PHEV). A plug-in hybrid-electric vehicle 112 may comprise one or more electric machines 114 mechanically coupled to a hybrid transmission 116. The electric machines 114 may be capable of operating as a motor or a generator. In addition, the hybrid transmission 116 is mechanically coupled to an engine 118. The hybrid transmission 116 is also mechanically coupled to a drive shaft 120 that is mechanically coupled to the wheels 122. The electric machines 114 can provide propulsion and deceleration capability when the engine 118 is turned on or off. The electric machines 114 may also act as generators and can provide fuel economy benefits by recovering energy that would normally be lost as heat in a friction braking system. The electric machines 114 may also reduce vehicle emissions by allowing the engine 118 to operate at more efficient speeds and allowing the hybrid-electric vehicle 112 to be operated in electric mode with the engine 118 off under certain conditions. An electrified vehicle 112 may also be a battery electric vehicle (BEV). In a BEV configuration, the engine 118 may not be present. In other configurations, the electrified vehicle 112 may be a full hybrid-electric vehicle (FHEV) without plug-in capability.

A traction battery or battery pack 124 stores energy that can be used by the electric machines 114. The vehicle battery pack 124 may provide a high voltage direct current (DC) output. The traction battery 124 may be electrically coupled to one or more power electronics modules 126. One or more contactors 142 may isolate the traction battery 124 from other components when opened and connect the traction battery 124 to other components when closed. The power electronics module 126 is also electrically coupled to the electric machines 114 and provides the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124.

The vehicle 112 may include a variable-voltage converter (VVC) 152 electrically coupled between the traction battery 124 and the power electronics module 126. The VVC 152 may be a DC/DC boost converter configured to increase or boost the voltage provided by the traction battery 124. By increasing the voltage, current requirements may be decreased leading to a reduction in wiring size for the power electronics module 126 and the electric machines 114. Further, the electric machines 114 may be operated with better efficiency and lower losses.

In addition to providing energy for propulsion, the traction battery 124 may provide energy for other vehicle electrical systems. The vehicle 112 may include a DC/DC converter module 128 that converts the high voltage DC output of the traction battery 124 to a low voltage DC supply that is compatible with low-voltage vehicle loads. An output of the DC/DC converter module 128 may be electrically coupled to an auxiliary battery 130 (e.g., 12V battery) for charging the auxiliary battery 130. The low-voltage systems may be electrically coupled to the auxiliary battery 130. One or more electrical loads 146 may be coupled to the high-voltage bus. The electrical loads 146 may have an associated controller that operates and controls the electrical loads 146 when appropriate. Examples of electrical loads 146 may be a fan, an electric heating element and/or an air-conditioning compressor.

The electrified vehicle 112 may be configured to recharge the traction battery 124 from an external power source 136. The external power source 136 may be a connection to an electrical outlet. The external power source 136 may be electrically coupled to a charger or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for plugging into a charge port 134 of the vehicle 112. The charge port 134 may be any type of port configured to transfer power from the EVSE 138 to the vehicle 112. The charge port 134 may be electrically coupled to a charger or on-board power conversion module 132. The power conversion module 132 may condition the power supplied from the EVSE 138 to provide the proper voltage and current levels to the traction battery 124. The power conversion module 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling.

One or more wheel brakes 144 may be provided for decelerating the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144 for vehicle deceleration. The brake system 150 may respond to driver commands and may also operate autonomously to implement features such as stability control. The controller of the brake system 150 may implement a method of applying a requested brake force when requested by another controller or sub-function.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1 but it may be implied that the vehicle network may connect to any electronic module that is present in the vehicle 112. A vehicle system controller (VSC) 148 may be present to coordinate the operation of the various components.

Figure 2:
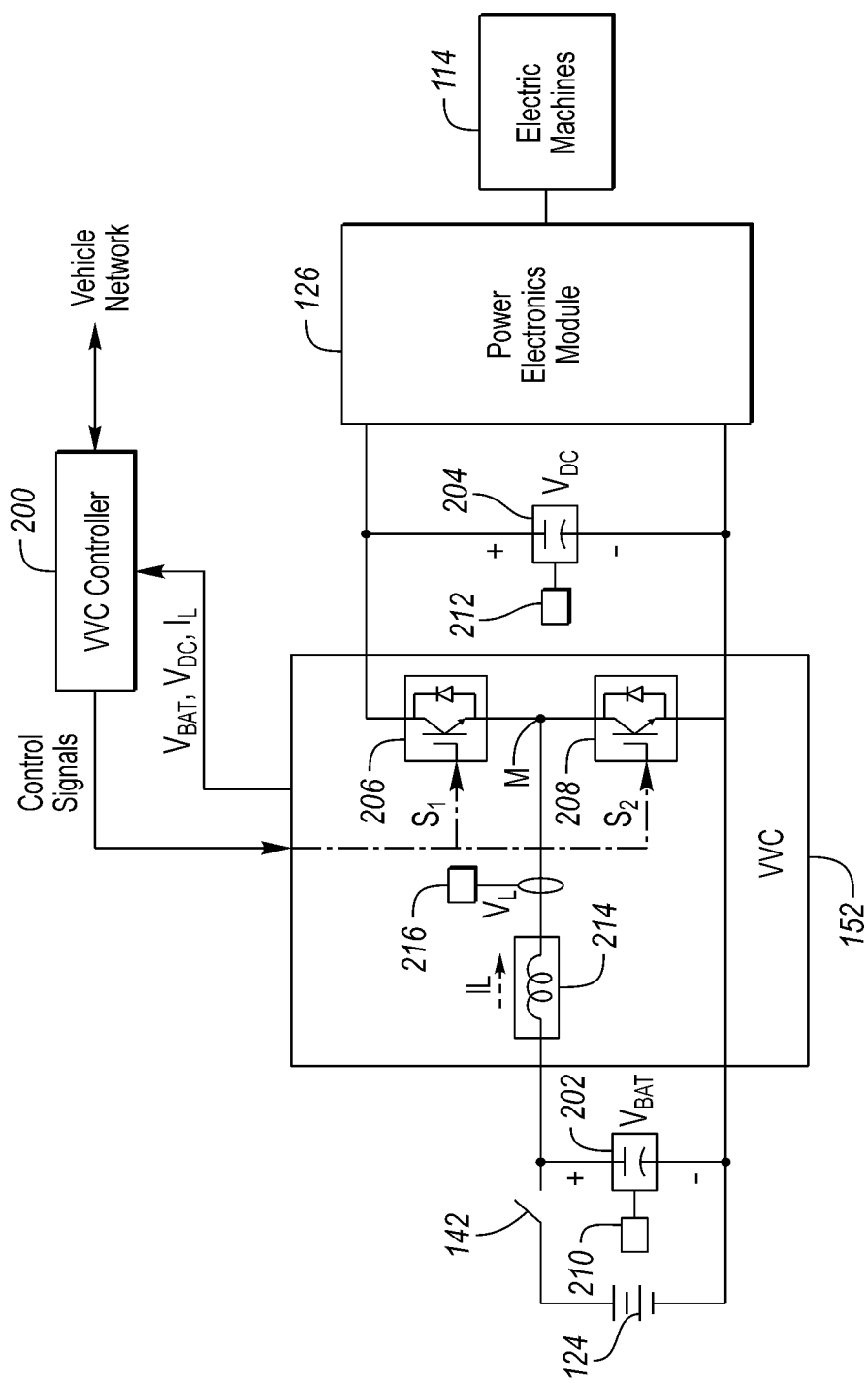
FIG. 2 is a schematic diagram of a vehicular variable voltage converter.

FIG. 2 depicts a diagram of a VVC 152 that is configured as a boost converter. The VVC 152 may include input terminals that may be coupled to terminals of the traction battery 124 through the contactors 142. The VVC 152 may include output terminals coupled to terminals of the power electronics module 126. The VVC 152 may be operated to cause a voltage at the output terminals to be greater than a voltage at the input terminals. The vehicle 112 may include a VVC controller 200 that monitors and controls electrical parameters (e.g., voltage and current) at various locations within the VVC 152. In some configurations, the VVC controller 200 may be included as part of the VVC 152. The VVC controller 200 may determine an output voltage reference, $V^*_{dc}$. The VVC controller 200 may determine, based on the electrical parameters and the voltage reference, $V^*_{dc}$, a control signal sufficient to cause the VVC 152 to achieve the desired output voltage. In some configurations, the control signal may be implemented as a pulse-width modulated (PWM) signal in which a duty cycle of the PWM signal is varied. The control signal may be operated at a predetermined switching frequency. The VVC controller 200 may command the VVC 152 to provide the desired output voltage using the control signal. The particular control signal at which the VVC 152 is operated may be directly related to the amount of voltage boost to be provided by the VVC 152.

The output voltage of the VVC 152 may be controlled to achieve a desired reference voltage. In some configurations, the VVC 152 may be a boost converter. In a boost converter configuration in which the VVC controller 200 controls the duty cycle, the ideal relationship between the input voltage $V_{in}$ and the output voltage $V_{out}$ and the duty cycle D may be illustrated using the following equation:

$$V_{out} = \frac{V_{in}}{(1-D)} \qquad 1)$$

The desired duty cycle, D, may be determined by measuring the input voltage (e.g., traction battery voltage) and setting the output voltage to the reference voltage. The VVC 152 may be a buck converter that reduces the voltage from input to output. In a buck configuration, a different expression relating the input and output voltage to the duty cycle may be derived. In some configurations, the VVC 152 may be a buck-boost converter that may increase or decrease the input voltage. The control strategy described herein is not limited to a particular variable voltage converter topology.

With reference to FIG. 2, the VVC 152 may boost or "step up" the voltage potential of the electrical power provided by the traction battery 124. The traction battery 124 may provide high voltage (HV) DC power. In some configurations, the traction battery 124 may provide a voltage between 150 and 400 Volts. The contactor 142 may be electrically coupled in series between the traction battery 124 and the VVC 152. When the contactor 142 is closed, the HV DC power may be transferred from the traction battery 124 to the VVC 152. An input capacitor 202 may be electrically coupled in parallel to the traction battery 124. The input capacitor 202 may stabilize the bus voltage and reduce any voltage and current ripple. The VVC 152 may receive the HV DC power and boost or "step up" the voltage potential of the input voltage according to the duty cycle.

An output capacitor 204 may be electrically coupled between the output terminals of the VVC 152. The output capacitor 204 may stabilize the bus voltage and reduce voltage and current ripple at the output of the VVC 152.

Further with reference to FIG. 2, the VVC 152 may include a first switching device 206 and a second switching device 208 for boosting an input voltage to provide the boosted output voltage. The switching devices 206, 208 may be configured to selectively flow a current to an electrical load (e.g., power electronics module 126 and electric machines 114). Each switching device 206, 208 may be individually controlled by a gate drive circuit (not shown) of the VVC controller 200 and may include any type of controllable switch (e.g., an insulated gate bipolar transistor (IGBT) or field-effect transistor (FET)). The gate drive circuit may provide electrical signals to each of the switching devices 206, 208 that are based on the control signal (e.g., duty cycle of PWM control signal). A diode may be coupled across each of the switching devices 206, 208. The switching devices 206, 208 may each have an associated switching loss. The switching losses are those power losses that occur during state changes of the switching device (e.g., on/off and off/on transitions). The switching losses may be quantified by the current flowing through and the voltage across the switching device 206, 208 during the transition. The switching devices may also have associated conduction losses that occur when the device is switched on.

The vehicle system may include sensors for measuring electrical parameters of the VVC 152. A first voltage sensor 210 may be configured to measure the input voltage, (e.g., voltage of the battery 124), and provide a corresponding input signal ($V_{bat}$) to the VVC controller 200. In one or more embodiments, the first voltage sensor 210 may measure the voltage across the input capacitor 202, which corresponds to the battery voltage. A second voltage sensor 212 may measure the output voltage of the VVC 152 and provide a corresponding input signal ($V_{dc}$) to the VVC controller 200. In one or more embodiments, the second voltage sensor 212 may measure the voltage across the output capacitor 204, which corresponds to the DC bus voltage. The first voltage sensor 210 and the second voltage sensor 212 may include circuitry to scale the voltages to a level appropriate for the VVC controller 200. The VVC controller 200 may include circuitry to filter and digitize the signals from the first voltage sensor 210 and the second voltage sensor 212.

An input inductor 214 may be electrically coupled in series between the traction battery 124 and the switching devices 206, 208. The input inductor 214 may alternate between storing and releasing energy in the VVC 152 to enable the providing of the variable voltages and currents as VVC 152 output, and the achieving of the desired voltage boost. A current sensor 216 may measure the input current through the input inductor 214 and provide a corresponding current signal ($I_L$) to the VVC controller 200. The input current through the input inductor 214 may be a result of the voltage difference between the input and the output voltage of the VVC 152, the conducting time of the switching devices 206, 208, and the inductance L of the input inductor 214. The VVC controller 200 may include circuitry to scale, filter, and digitize the signal from the current sensor 216.

The VVC controller 200 may be programmed to control the output voltage of the VVC 152. The VVC controller 200 may receive input from the VVC 152 and other controllers via the vehicle network, and determine the control signals. The VVC controller 200 may monitor the input signals ($V_{bat}$, $V_{dc}$, $I_L$, $V^*_{dc}$) to determine the control signals. For example, the VVC controller 200 may provide control signals to the gate drive circuit that correspond to a duty cycle command. The gate drive circuit may then control each switching device 206, 208 based on the duty cycle command.

The control signals to the VVC 152 may be configured to drive the switching devices 206, 208 at a particular switching frequency. Within each cycle of the switching frequency, the switching devices 206, 208 may be operated at the specified duty cycle. The duty cycle defines the amount of time that the switching devices 206, 208 are in an on-state and an off-state. For example, a duty cycle of 100% may operate the switching devices 206, 208 in a continuous on-state with no turn off. A duty cycle of 0% may operate the switching devices 206, 208 in a continuous off-state with no turn on. A duty cycle of 50% may operate the switching devices 206, 208 in an on-state for half of the cycle and in an off-state for half of the cycle. The control signals for the two switches 206, 208 may be complementary. That is, the control signal sent to one of the switching devices (e.g., 206) may be an inverted version of the control signal sent to the other switching device (e.g., 208).

The current that is controlled by the switching devices 206, 208 may include a ripple component that has a magnitude that varies with a magnitude of the current, and the duty cycle and switching frequency of the switching devices 206, 208. Relative to the input current, the worst case ripple current magnitude occurs during relatively high input current conditions. When the duty cycle is fixed, an increase in the inductor current causes an increase in magnitude of the ripple current as illustrated in FIG. 4. The magnitude of the ripple current is also related to the duty cycle. The highest magnitude ripple current occurs when the duty cycle equals 50%. The general relationship between the inductor ripple current magnitude and the duty cycle may be as shown in FIG. 5. Based on these facts, it may be beneficial to implement measures to reduce the ripple current magnitude under high current and mid-range duty cycle conditions.

When designing the VVC 152, the switching frequency and the inductance value of the inductor 214 may be selected to satisfy a maximum allowable ripple current magnitude. The ripple component may be a periodic variation that appears on a DC signal. The ripple component may be defined by a ripple component magnitude and a ripple component frequency. The ripple component may have harmonics that are in an audible frequency range that may add to the noise signature of the vehicle. Further, the ripple component may cause difficulties with accurately controlling devices fed by the source. During switching transients, the switching devices 206, 208 may turn off at the maximum inductor current (DC current plus ripple current) which may cause large voltage spike across the switching devices 206, 208. Because of size and cost constraints, the inductance value may be selected based on the conducted current. In general, as current increases the inductance may decrease due to saturation.

The switching frequency may be selected to limit a magnitude of the ripple current component under worst case scenarios (e.g., highest input current and/or duty cycle close to 50% conditions). The switching frequency of the switching devices 206, 208 may be selected to be a frequency (e.g., 10 kHz) that is greater than a switching frequency of the motor/generator inverter (e.g., 5 kHz) that is coupled to an output of the VVC 152. In some applications, the switching frequency of the VVC 152 may be selected to be a predetermined fixed frequency. The predetermined fixed frequency is generally selected to satisfy noise and ripple current specifications. However, the choice of the predetermined fixed frequency may not provide best performance over all operating ranges of the VVC 152. The predetermined fixed frequency may provide best results at a particular set of operating conditions, but may be a compromise at other operating conditions.

Increasing the switching frequency may decrease the ripple current magnitude and lower voltage stress across the switching devices 206, 208, but may lead to higher switching losses. While the switching frequency may be selected for worst case ripple conditions, the VVC 152 may only operate under the worst case ripple conditions for a small percentage of the total operating time. This may lead to unnecessarily high switching losses that may lower fuel economy. In addition, the fixed switching frequency may concentrate the noise spectrum in a very narrow range. The increased noise density in this narrow range may result in noticeable noise, vibration, and harshness (NVH) issues.

The VVC controller 200 may be programmed to vary the switching frequency of the switching devices 206, 208 based on the duty cycle and the input current. The variation in switching frequency may improve fuel economy by reducing switching losses and reduce NVH issues while maintaining ripple current targets under worst case operating conditions.

During relatively high current conditions, the switching devices 206, 208 may experience increased voltage stress. At a maximum operating current of the VVC 152, it may be desired to select a relatively high switching frequency that reduces the ripple component magnitude with a reasonable level of switching losses. The switching frequency may be selected based on the input current magnitude such that as the input current magnitude increases, the switching frequency increases. The switching frequency may be increased up to a predetermined maximum switching frequency. The predetermined maximum switching frequency may be a level that provides a compromise between lower ripple component magnitudes and higher switching losses. The switching frequency may be changed in discrete steps or continuously over the operating current range.

The VVC controller 200 may be programmed to reduce the switching frequency in response to the current input being less than a predetermined maximum current. The predetermined maximum current may be a maximum operating current of the VVC 152. The change in the switching frequency may be based on the magnitude of the current input to the switching devices 206, 208. When the current is greater than the predetermined maximum current, the switching frequency may be set to a predetermined maximum switching frequency. As the current decreases, the magnitude of the ripple component decreases. By operating at lower switching frequencies as the current decreases, switching losses are reduced. The switching frequency may be varied based on the power input to the switching devices. As the input power is a function of the input current and the battery voltage, the input power and input current may be used in a similar manner.

Since the ripple current is also affected by the duty cycle, the switching frequency may be varied based on the duty cycle. The duty cycle may be determined based on a ratio of the input voltage to the output voltage. As such, the switching frequency may also be varied based on the ratio between the input voltage and the output voltage. When the duty cycle is near 50%, the predicted ripple current magnitude is a maximum value and the switching frequency may be set to the predetermined maximum frequency. The predetermined maximum frequency may be a maximum switching frequency value that is selected to minimize the ripple current magnitude. The switching frequency may be changed in discrete steps or continuously over the duty cycle range.

The VVC controller 200 may be programmed to reduce the switching frequency from the predetermined maximum frequency in response to a magnitude of a difference between the duty cycle and the duty cycle value (e.g, 50%) at which the predicted ripple component magnitude is a maximum. When the magnitude of the difference is less than a threshold, the switching frequency may be set to the predetermined frequency. When the magnitude of the difference decreases, the switching frequency may be increased toward the predetermined maximum frequency to reduce the ripple component magnitude. When the magnitude of the difference is less than a threshold, the switching frequency may be set to the predetermined maximum frequency.

The switching frequency may be limited to be between the predetermined maximum frequency and a predetermined minimum frequency. The predetermined minimum frequency may be a frequency level that is greater than a predetermined switching frequency of the power electronic module 126 that is coupled to an output of the variable voltage converter 152. The switching frequency may also be based on parasitic inductance associated with the gate of the IGBT.

Figure 3:
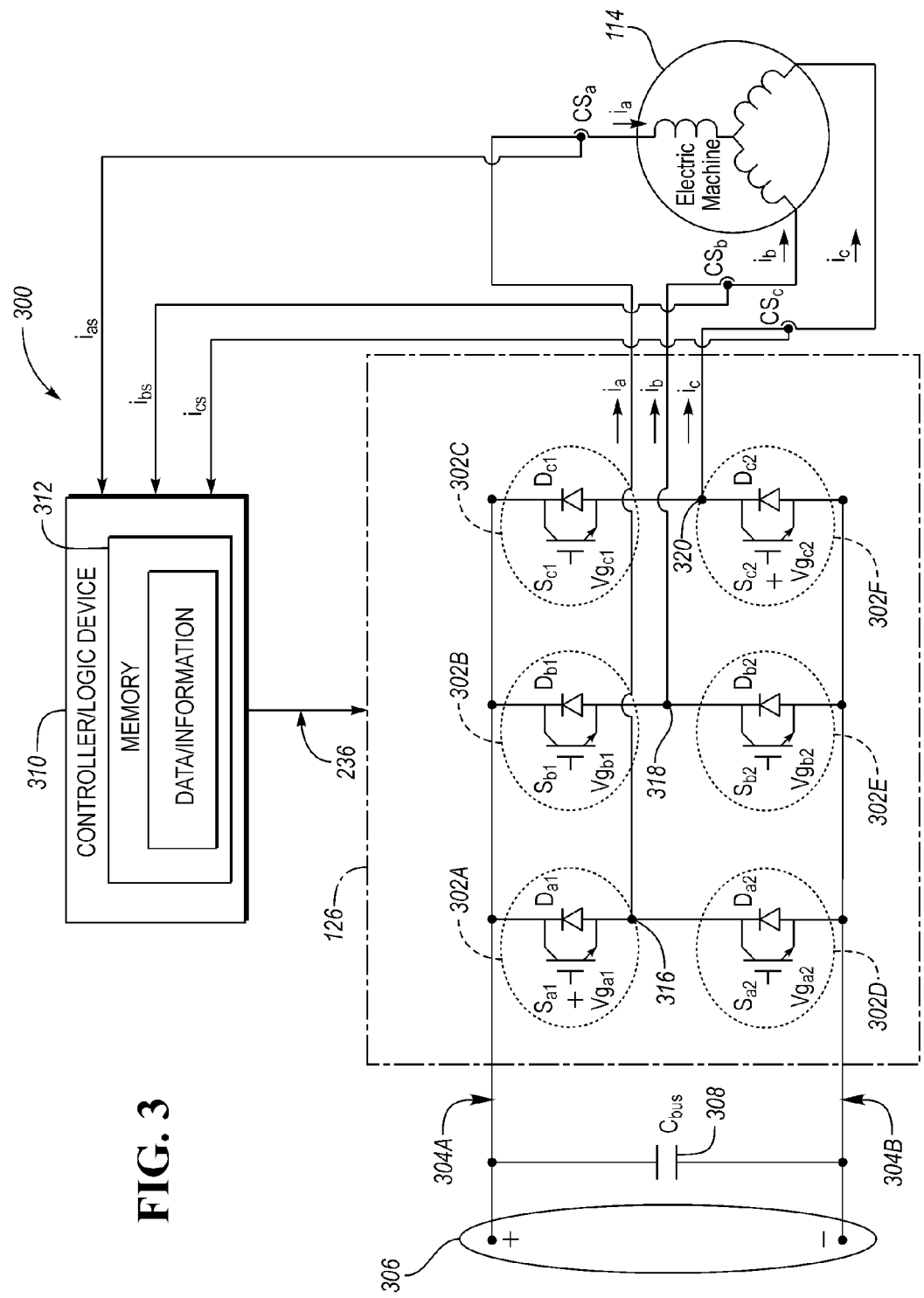
FIG. 3 is a schematic diagram of a vehicular electric machine inverter.

With reference to FIG. 3, a system 300 is provided for controlling a power electronics module (PEM) 126. The PEM 126 of FIG. 3 is shown to include a plurality of switches 302 (e.g., IGBTs) configured to collectively operate as an inverter with first, second, and third phase legs 316, 318, 320. While the inverter is shown as a three-phase converter, the inverter may include additional phase legs. For example, the inverter may be a four-phase converter, a five-phase converter, a six-phase converter, etc. In addition, the PEM 126 may include multiple converters with each inverter in the PEM 126 including three or more phase legs. For example, the system 300 may control two or more inverters in the PEM 126. The PEM 126 may further include a DC to DC converter having high power switches (e.g., IGBTs) to convert a power electronics module input voltage to a power electronics module output voltage via boost, buck or a combination thereof.

As shown in FIG. 3, the inverter may be a DC-to-AC converter. In operation, the DC-to-AC converter receives DC power from a DC power link 306 through a DC bus 304 and converts the DC power to AC power. The AC power is transmitted via the phase currents ia, ib, and ic to drive an AC machine also referred to as an electric machine 114, such as a three-phase permanent-magnet synchronous motor (PMSM) as depicted in FIG. 3. In such an example, the DC power link 306 may include a DC storage battery to provide DC power to the DC bus 304. In another example, the inverter may operate as an AC-to-DC converter that converts AC power from the AC machine 114 (e.g., generator) to DC power, which the DC bus 304 can provide to the DC power link 306. Furthermore, the system 300 may control the PEM 126 in other power electronic topologies.

With continuing reference to FIG. 3, each of the phase legs 316, 318, 320 in the inverter includes power switches 302, which may be implemented by various types of controllable switches. In one embodiment, each power switch 302 may include a diode and a transistor, (e.g., an IGBT). The diodes of FIG. 3 are labeled $D_{a1}$, $D_{a2}$, $D_{b1}$, $D_{b2}$, $D_{c1}$, and $D_{c2}$ while the IGBTs of FIG. 3 are respectively labeled $S_{a1}$, $S_{a2}$, $S_{b1}$, $S_{b2}$, $S_{c1}$, and $S_{c2}$. The power switches $S_{a1}$, $S_{a2}$, $D_{a1}$, and $D_{a2}$ are part of phase leg A of the three-phase converter, which is labeled as the first phase leg A 316 in FIG. 3. Similarly, the power switches $S_{b1}$, $S_{b2}$, $D_{b1}$, and $D_{b2}$ are part of phase leg B 318 and the power switches $S_{c1}$, $S_{c2}$, $D_{c1}$, and $D_{c2}$ are part of phase leg C 320 of the three-phase converter. The inverter may include any number of the power switches 302 or circuit elements depending on the particular configuration of the inverter. The diodes ($D_{xx}$) are connected in parallel with the IGBTs ($S_{xx}$) however, as the polarities are reversed for proper operation, this configuration is often referred to as being connected anti-parallel. A diode in this anti-parallel configuration is also called a freewheeling diode.

As illustrated in FIG. 3, current sensors $CS_a$, $CS_b$, and $CS_c$ are provided to sense current flow in the respective phase legs 316, 318, 320. FIG. 3 shows the current sensors $CS_a$, $CS_b$, and $CS_c$ separate from the PEM 126. However, current sensors $CS_a$, $CS_b$, and $CS_c$ may be integrated as part of the PEM 126 depending on its configuration. Current sensors $CS_a$, $CS_b$, and $CS_c$ of FIG. 3 are installed in series with each of phase legs A, B and C (i.e., phase legs 316, 318, 320 in FIG. 3) and provide the respective feedback signals $i_{as}$, $i_{bs}$, and $i_{cs}$ (also illustrated in FIG. 3) for the system 300. The feedback signals $i_{as}$, $i_{bs}$, and $i_{cs}$ may be raw current signals processed by logic device (LD) 310 or may be embedded or encoded with data or information about the current flow through the respective phase legs 316, 318, 320. Also, the power switches 302 (e.g., IGBTs) may include current sensing capability. The current sensing capability may include being configured with a current mirror output, which may provide data/signals representative of $i_{as}$, $i_{bs}$, and $i_{cs}$. The data/signals may indicate a direction of current flow, a magnitude of current flow, or both the direction and magnitude of current flow through the respective phase legs A, B, and C.

Referring again to FIG. 3, the system 300 includes a logic device (LD) or controller 310. The controller or LD 310 can be implemented by various types or combinations of electronic devices and/or microprocessor-based computers or controllers. To implement a method of controlling the PEM 126, the controller 310 may execute a computer program or algorithm embedded or encoded with the method and stored in volatile and/or persistent memory 312. Alternatively, logic may be encoded in discrete logic, a microprocessor, a microcontroller, or a logic or gate array stored on one or more integrated circuit chips. As shown in the embodiment of FIG. 3, the controller 310 receives and processes the feedback signals $i_{as}$, $i_{bs}$, and $i_{cs}$ to control the phase currents $i_a$, $i_b$, and $i_c$ such that the phase currents $i_a$, $i_b$, and $i_c$ flow through the phase legs 316, 318, 320 and into the respective windings of the electric machine 114 according to various current or voltage patterns. For example, current patterns can include patterns of phase currents $i_a$, $i_b$, and $i_c$ flowing into and away from the DC-bus 304 or a DC-bus capacitor 308. The DC-bus capacitor 308 of FIG. 3 is shown separate from the PEM 126. However, the DC-bus capacitor 308 may be integrated as part of the PEM 126.

As shown in FIG. 3, a storage medium 312 (hereinafter "memory"), such as computer-readable memory may store the computer program or algorithm embedded or encoded with the method. In addition, the memory 312 may store data or information about the various operating conditions or components in the PEM 126. For example, the memory 312 may store data or information about current flow through the respective phase legs 316, 318, 320. The memory 312 can be part of the controller 310 as shown in FIG. 3. However, the memory 312 may be positioned in any suitable location accessible by the controller 310.

As illustrated in FIG. 3, the controller 310 transmits at least one control signal 236 to the power converter system 126. The power converter system 126 receives the control signal 322 to control the switching configuration of the inverter and therefore the current flow through the respective phase legs 316, 318, and 320. The switching configuration is a set of switching states of the power switches 302 in the inverter. In general, the switching configuration of the inverter determines how the inverter converts power between the DC power link 306 and the electric machine 114.

To control the switching configuration of the inverter, the inverter changes the switching state of each power switch 302 in the inverter to either an ON state or an OFF state based on the control signal 322. In the illustrated embodiment, to switch the power switch 302 to either ON or OFF states, the controller/LD 310 provides the gate voltage (Vg) to each power switch 302 and therefore drives the switching state of each power switch 302. Gate voltages $Vg_{a1}$, $Vg_{a2}$, $Vg_{b1}$, $Vg_{b2}$, $Vg_{c1}$, and $Vg_{c2}$ (shown in FIG. 3) control the switching state and characteristics of the respective power switches 302. While the inverter is shown as a voltage-driven device in FIG. 3, the inverter may be a current-driven device or controlled by other strategies that switch the power switch 302 between ON and OFF states. The controller 310 may change the gate drive for each IGBT based on the rotational speed of the electric machine 114, the mirror current, or a temperature of the IGBT switch. The change in gate drive may be selected from a plurality of gate drive currents in which the change gate drive current is proportional to a change in IGBT switching speed.

As also shown in FIG. 3, each phase leg 316, 318, and 320 includes two switches 302. However, only one switch in each of the legs 316, 318, 320 can be in the ON state without shorting the DC power link 306. Thus, in each phase leg, the switching state of the lower switch is typically opposite the switching state of the corresponding upper switch. Consequently, a HIGH state of a phase leg refers to the upper switch in the leg in the ON state with the lower switch in the OFF state. Likewise, a LOW state of the phase leg refers to the upper switch in the leg in the OFF state with the lower switch in the ON state. As a result, IGBTs with current mirror capability may be on all IGBTs, a subset of IGBTs (e.g., $S_{a1}$, $S_{b1}$, $S_{c1}$) or a single IGBT.

Two situations can occur during an active state of the three-phase converter example illustrated in FIG. 2: (1) two phase legs are in the HIGH state while the third phase leg is in the LOW state, or (2) one phase leg is in the HIGH state while the other two phase legs are in the LOW state. Thus, one phase leg in the three-phase converter, which may be defined as the "reference" phase for a specific active state of the inverter, is in a state opposite to the other two phase legs, or "non-reference" phases, that have the same state. Consequently, the non-reference phases are either both in the HIGH state or both in the LOW state during an active state of the inverter.

Figure 4B:
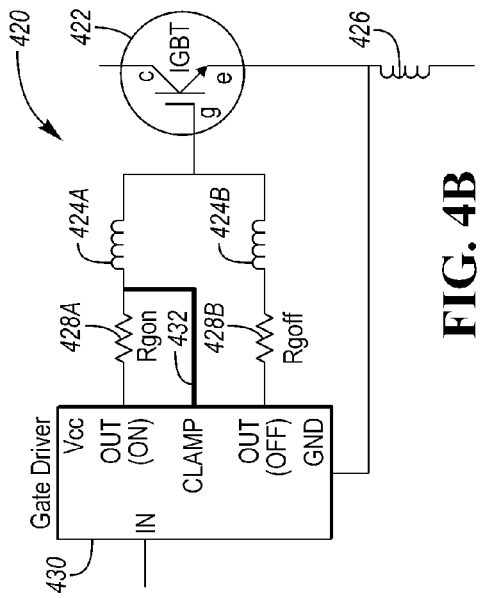
FIG. 4B is a schematic diagram of a gate drive circuit for an IGBT having dual gate loop coupling coefficients using two gate terminals.
Figure 4D:
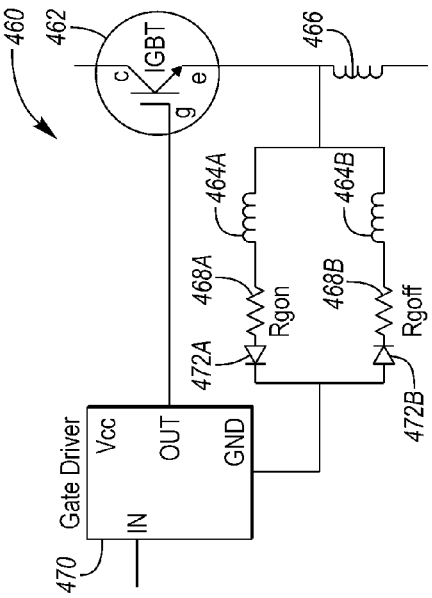
FIG. 4D is a schematic diagram of a gate drive circuit for an IGBT having dual gate loop coupling coefficients using dual Kelvin emitters.
Figure 4A:
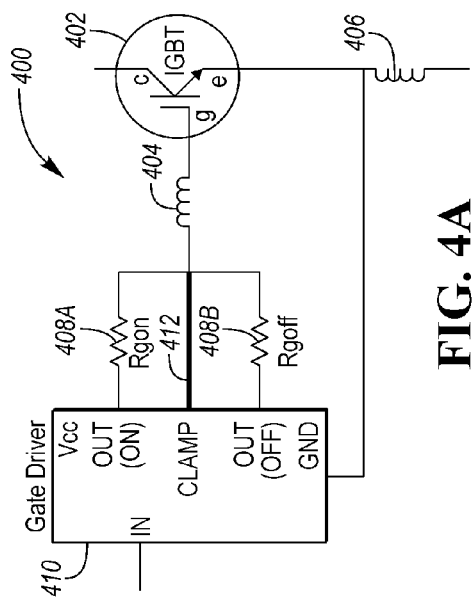
FIG. 4A is a schematic diagram of a gate drive circuit for an IGBT having a single gate loop coupling coefficient between a gate loop inductance and a power loop inductance.

FIG. 4A is a schematic diagram of a gate drive circuit 400 for an IGBT 402 having a single gate loop coupling coefficient between a gate loop inductance 404 and a power loop inductance 406. In this embodiment, a single gate lead is used to control turn-on and turn-off via the use of an on-resistance 408A and an off-resistance 408B. The on-resistance 408A and off-resistance 408B are selected to independently adjust the turn-on and turn-off of the IGBT 402 when driven by a gate driver 410. Also, this gate drive circuit 400 may include a miller clamp connection 412 to aid in preventing shoot-through. Shoot-though is a condition when an upper device and lower device in a half-bridge configuration are conducting simultaneously. Also, with this gate drive circuit 400 a mutual inductance exists between the gate loop inductance 404 and the power loop inductance 406. This mutual inductance has an inductance coefficient that is in the gate turn-on loop, the gate turn-off loop and the miller clamp connection. In the past, circuit designers had to consider this single coefficient to all three aspects of the operation.

Here, circuits are disclosed that have independent inductance coefficients that are tuned for turn-on and turn-off. In some embodiments, a miller clamp connection is provided with an inductance coefficient distinct from the turn-on and turn-off inductance coefficient.

FIG. 4B is a schematic diagram of a gate drive circuit 420 for an IGBT 422 having dual gate loop coupling coefficients using two gate terminals. In this embodiment, coupling coefficients between gate loop inductances 424A, 424B and a power loop inductance 426 are separate and independent. In this embodiment, the use of dual gate leads allows the gate drive circuit 420 to be tuned for both turn-on and turn-off via the use of an on-resistance 428A and an off-resistance 428B. The on-resistance 428A and off-resistance 428B are selected to independently adjust the turn-on and turn-off of the IGBT 422 when driven by a gate driver 430. Also, this gate drive circuit 420 may include a miller clamp connection 432 to aid in preventing shoot-through. Shoot-though is a condition when an upper device and lower device in a half-bridge configuration are conducting simultaneously. This gate drive circuit 420 has an "on" mutual inductance between the gate loop inductance 424A and the power loop inductance 426, and an "off" mutual inductance between the gate loop inductance 424B and the power loop inductance 426. Also, a miller clamp connection 432 may be coupled in parallel with the on-resistance 428A or the off-resistance 428B. If the miller clamp connection 432 is coupled in parallel with the on-resistance 428A, the miller clamp will have an inductive coefficient based on the "on" mutual inductance between the gate loop inductance 424A and the power loop inductance 426. If the miller clamp connection 432 is coupled in parallel with the off-resistance 428B, the miller clamp will have an inductive coefficient based on the "off" mutual inductance between the gate loop inductance 424B and the power loop inductance 426.

Figure 4C:
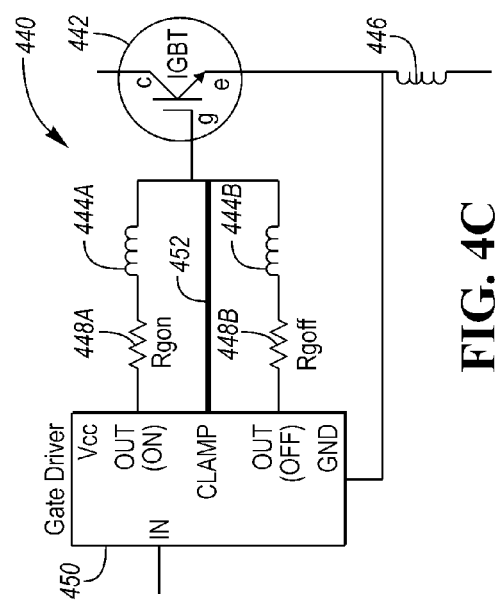
FIG. 4C is a schematic diagram of a gate drive circuit for an IGBT having dual gate loop coupling coefficients using three gate terminals.

FIG. 4C is a schematic diagram of a gate drive circuit for an IGBT 442 having three gate loop coupling coefficients using three gate terminals. In this embodiment, coupling coefficients between a miller clamp connection 452, gate loop inductances 444A, 444B and a power loop inductance 446 are separate and independent. The use of three gate leads allows the gate drive circuit 440 to be tuned for turn-on and turn-off via the use of an on-resistance 448A and an off-resistance 448B. The on-resistance 448A and off-resistance 448B are selected to independently adjust the turn-on and turn-off of the IGBT 442 when driven by a gate driver 450. This gate drive circuit 440 is shown having the miller clamp connection 452 to aid in preventing shoot-through. This gate drive circuit 440 has an "on" mutual inductance between the gate loop inductance 444A and the power loop inductance 446, and an "off" mutual inductance between the gate loop inductance 444B and the power loop inductance 446. Also, this gate drive circuit 440 is shown with a miller clamp connection 452 that has a separate and independent inductive coefficient as it does not share the "on" gate loop inductance 444A or the "off" gate loop inductance 444B.

FIG. 4D is a schematic diagram of a gate drive circuit 460 for an IGBT 462 having dual gate loop coupling coefficients using dual Kelvin emitters. In this embodiment, coupling coefficients between Kelvin emitter loop inductances 464A, 464B and a power loop inductance 466 are separate and independent. The dual Kelvin emitter leads allow the gate drive circuit 460 to be tuned for both turn-on and turn-off via the use of an on-resistance 468A and an off-resistance 468B. The on-resistance 468A and off-resistance 468B are selected to independently adjust the turn-on and turn-off of the IGBT 462 when driven by a gate driver 470. The on-resistance 468A and kelvin emitter on inductance 464A are in a return path of the low voltage turn-on control loop (i.e., gate loop), and the off-resistance 468B and kelvin emitter on inductance 464B are in a return path of the low voltage turn-off control loop. This gate drive circuit 460 has an "on" mutual inductance between the gate loop inductance 464A and the power loop inductance 466, and an "off" mutual inductance between the gate loop inductance 464B and the power loop inductance 466. The on-resistance 468A and off-resistance 468B are selected to independently adjust the turn-on and turn-off of the IGBT 462 when driven by a gate driver 470. As this gate drive circuit 460 utilizes dual Kelvin emitters with distinct and independent gate control loop inductors 464A, 464B in the return path, the use of blocking diodes 472A, 472B are used to control current flow in the control loops.

FIG. 5A is a schematic diagram of a typical phase leg 500 of the inverter of FIG. 3 used to drive an electric machine. This circuit may be implemented via discrete components or this circuit may be implemented in a packed module. Discrete components may be packaged in standard device packages including TO-252 DPAK, TO-263 D$^2$PAK, TO-220, TO-247 or in module packages including ceramic substrate, metal substrates, transfer mold type power modules (TPM), power modules based on DBC and wire-bonding technologies. The IGBT and diodes may be standard device or wide bandgap (WBG) devices including silicon, silicon carbide (SiC) and gallium nitride (GaN) or industry known technology. The IGBT and diode may be monolithically separate such as a silicon IGBT with a SiC diode, or the IGBT and diode may be monolithic. Likewise, the upper IGBT and diode and lower IGBT and diode may be discrete or may be monolithic. The gate resistors Rg1 and Rg2 are typically not a monolithically integrated aspect of the die. Often, an IGBT device is provided in die form and bond wires, including solid wires, braided wires, ribbons, or clips, provide the electric connection and current carrying capacity from the die to the leads of the package or module. Also, the gate resistors are typically connected to the gate of the IGBT via the bond wires.

FIG. 5B is an illustration of a plan layout of a typical phase leg 510 with dual IGBTs (S1, S2) each having dual gate terminals (gon1, goff1, gon2, goff2). This dual IGBT component also referred to as a half bridge module 510 includes a positive power terminal 512 that is connected with the collector of the high side IGBT, a load output 514 that is connected with the emitter of the high side IGBT and the collector of the low side IGBT, and a negative power terminal 516 that is connected with the emitter of the low side IGBT. The high side IGBT or switch 1 (S1) 526 includes two gate leads, a turn-off gate lead (goff1) 518A and a turn-on gate lead (gon1) 518B. In this illustration, the gate leads (goff1 and gon1) are connected and shown as a single conductor, with a single gate bond wire 520 providing the connection with the gate pad of the power device. A Kelvin emitter lead 522 is connected with the emitter of the die via a Kelvin emitter bond wire 514. The low side IGBT or switch 2 (S2) 536 includes two gate leads, a turn-off gate lead (goff2) 528A and a turn-on gate lead (gon2) 528B. In this illustration, the gate leads (goff2 and gon2) are connected and shown as a single conductor, with a single gate bond wire 530 providing the connection with the gate pad of the power device. A Kelvin emitter lead 532 is connected with the emitter of the die via a Kelvin emitter bond wire 534.

In other embodiments, the turn-off gate lead (goff1) 518A and turn-on gate lead (gon1) 518B may be separate whereas each is connected to the gate pad via a turn-off gate bond wire and a turn-on gate bond wire. Further, to adjust the coupling coefficient of the turn-off gate lead and the turn-on gate lead, the turn-off gate bond wire and turn-on gate bond wire may be configured with different impedances. The different impedances may be due to different lengths of bond wires, different materials used for the bond wires, different routing of the bond wires, and different diameters of the bond wires. For example, one bond wire may be routed near the load output 514 while the other bond wire may be routed away from the load output 514 (such as on the other side of the module.) Likewise, the turn-off gate lead (goff2) 528A and turn-on gate lead (gon2) 528B may be separate whereas each is connected to the gate pad via a turn-off gate bond wire and a turn-on gate bond wire. The coupling coefficient of the turn-off gate lead and the turn-on gate lead may also be adjusted as the turn-off gate bond wire and turn-on gate bond wire may be configured with different impedances. The different impedances may be due to different lengths of bond wires, different materials used for the bond wires, different routing of the bond wires, and different diameters of the bond wires. For example, one bond wire may be routed near the load output 514 while the other bond wire may be routed away from the load output 514 (such as on the other side of the module.)

FIG. 5C is an illustration of a plan layout of a typical phase leg 540 with dual IGBTs (S1, S2) each having dual gate terminals (gon1, goff1, gon2, goff2). This dual IGBT component also referred to as a half bridge module 540 includes a positive power terminal 542 that is connected with the collector of the high side IGBT, a load output 544 that is connected with the emitter of the high side IGBT and the collector of the low side IGBT, and a negative power terminal 546 that is connected with the emitter of the low side IGBT. The high side IGBT or switch 1 (S1) 556 includes two gate leads, a turn-off gate lead (goff1) 548A and a turn-on gate lead (gon1) 548B. In this illustration, the gate leads (goff1 and gon1) are connected and shown as a single conductor, with a single gate bond wire 550 providing the connection with the gate pad of the power device. A Kelvin emitter lead 552 is connected with the emitter of the die via a Kelvin emitter bond wire 564. The low side IGBT or switch 2 (S2) 566 includes two gate leads, a turn-off gate lead (goff2) 558A and a turn-on gate lead (gon2) 558B. In this illustration, the gate leads (goff2 and gon2) are connected and shown as a single conductor, with a single gate bond wire 560 providing the connection with the gate pad of the power device. A Kelvin emitter lead 562 is connected with the emitter of the die via a Kelvin emitter bond wire 564.

In this illustration, the turn-off gate lead (goff1) 548A is shown to be longer than the turn-on gate lead (gon1) 548B, and the turn-off gate lead (goff2) 558A is illustrated to be longer than the turn-on gate lead (gon1) 558B. In another embodiment, one of the gate leads, for example, the turn-off gate lead (goff1) 548A may be routed near the load output 544 to adjust the coupling coefficient while the other gate lead, the turn-on gate lead (gon1) 548B may be routed away from the load output 544. Likewise, the turn-off gate lead (goff2) 558A may be routed near the load output 544 to adjust the coupling coefficient while the other gate lead, the turn-on gate lead (gon2) 558B may be routed away from the load output 544.

Figure 5D:
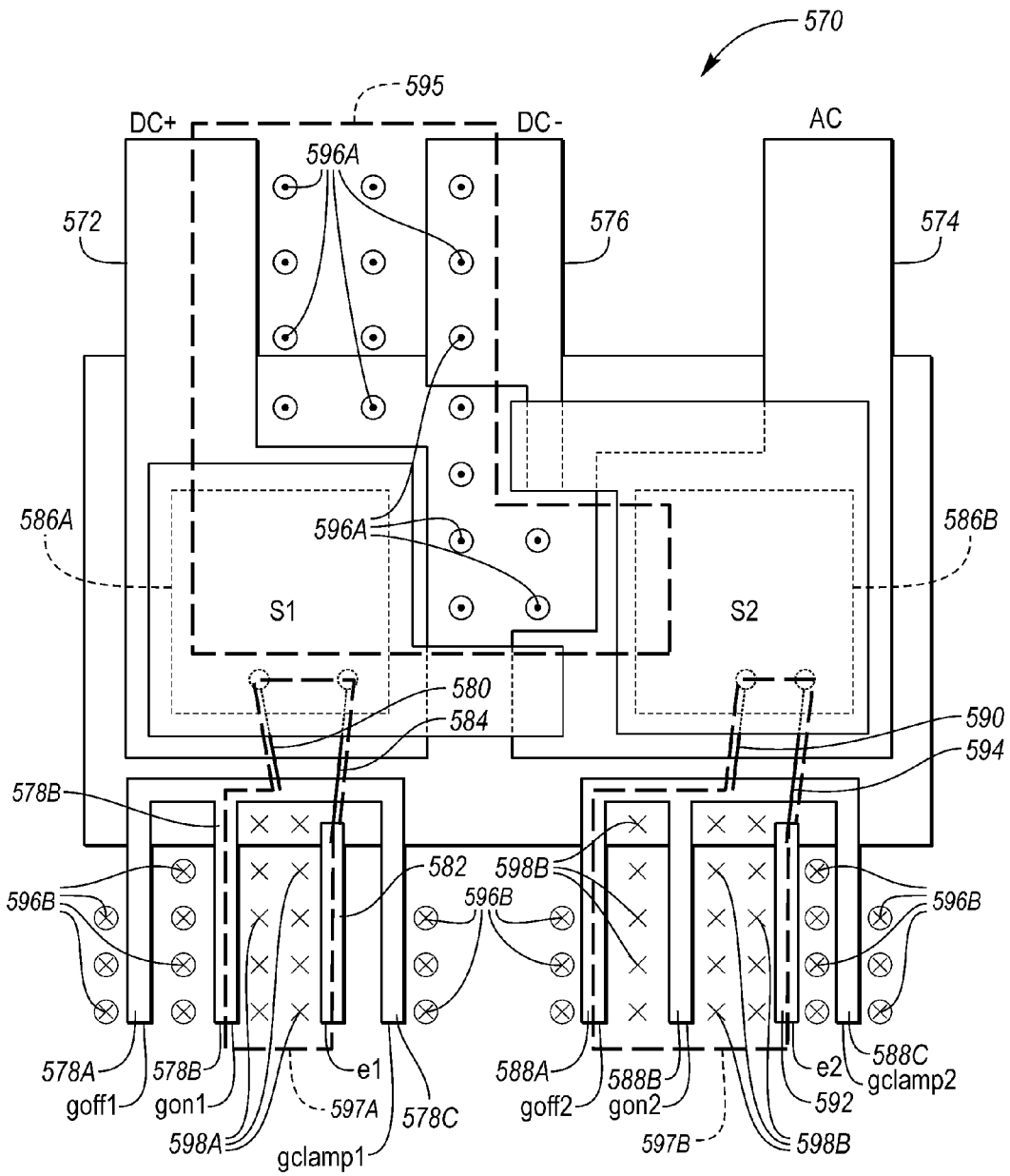
FIG. 5D is an illustration of a plan layout of a typical phase leg with dual IGBTs each having three asymmetric lead length gate terminals.

FIG. 5D is an illustration of a plan layout of a typical phase leg 570 with dual IGBTs (S1, S2) each having dual gate terminals (gon1, goff1, gon2, goff2) and gate clamp connections (gclamp1, gclamp2). This dual IGBT component also referred to as a half bridge module 570 includes a positive power terminal 572 that is connected with the collector of the high side IGBT, a load output 574 that is connected with the emitter of the high side IGBT and the collector of the low side IGBT, and a negative power terminal 576 that is connected with the emitter of the low side IGBT. The high side IGBT or switch 1 (S1) 586A includes three gate leads, a turn-off gate lead (goff1) 578A, a turn-on gate lead (gon1) 578B, and a clamp gate lead (gclamp1) 578C. In this illustration, the gate leads (goff1, gon1, and gclamp1) are connected and shown as a single conductor, with a single gate bond wire 580 providing the connection with the gate pad of the power device. A Kelvin emitter lead 582 is connected with the emitter of the die via a Kelvin emitter bond wire 584. The low side IGBT or switch 2 (S2) 586B includes three gate leads, a turn-off gate lead (goff2) 588A, a turn-on gate lead (gon2) 588B, and a clamp gate lead (gclamp2) 578C. In this illustration, the gate leads (goff2, gon2, and gclamp2) are connected and shown as a single conductor, with a single gate bond wire 590 providing the connection with the gate pad of the power device. A Kelvin emitter lead 592 is connected with the emitter of the die via a Kelvin emitter bond wire 594.

In other embodiments, the turn-off gate lead (goff1) 578A, turn-on gate lead (gon1) 578B, and clamp gate lead (gclamp1) 578C may be separate whereas each is connected to the gate pad via a turn-off gate bond wire and a turn-on gate bond wire. Further, to adjust the coupling coefficient of the turn-off gate lead and the turn-on gate lead, the turn-off gate bond wire, turn-on gate bond wire, and gate clamp bond wire may be configured with different impedances. The different impedances may be due to different lengths of bond wires, different materials used for the bond wires, different routing of the bond wires, and different diameters of the bond wires. For example, one bond wire may be routed near the load output 514 while the other bond wires may be routed away from the load output 514 (such as on the other side of the module.) Likewise, the turn-off gate lead (goff2) 588A, turn-on gate lead (gon2) 588B, and clamp gate lead (gclamp2) 588C may be separate whereas each is connected to the gate pad via a turn-off gate bond wire, a turn-on gate bond wire, and a clamp gate bond wire. The coupling coefficient of the turn-off gate lead, the turn-on gate lead, and the clamp gate lead may also be adjusted as the turn-off gate bond wire and turn-on gate bond wire may be configured with different impedances. The different impedances may be due to different lengths of bond wires, different materials used for the bond wires, different routing of the bond wires, and different diameters of the bond wires. For example, one bond wire may be routed near the load output 514 while other bond wires may be routed away from the load output 514 (such as on the other side of the module.)

Here a power loop is formed when power flows from the DC+ terminal to the load (AC) or from the load (AC) to the DC− terminal. Thus, the power loop 595 is formed from the DC+ terminal to the DC− terminal. Based on the direction of the current flowing in the power loop 595, an induced field is generated 596 that include positive field lines 596A and negative field lines 596B. The field lines are based on a cross product of the current vector and a rotational vector of the induced magnetic field. In this illustration, positive field lines 596A may be thought of as extending up from the plane of the image, and negative field lines 596B may be thought of as traveling down into the plane of the image. The power loop 595 typically carries high current from a high voltage source. In contrast, the control loop 597 that includes a gate turn-on loop 597A and a gate turn-off loop 597B. The gate turn-on loop 597A produces a positive magnetic field 598A and the gate turn-off loop 597B produces a positive magnetic field 598B. In this illustration, the turn-on loop 597A and turn-off loop 597B may be configured to have a different inductance and have a different mutual inductance coefficient by changing the gate loop areas or locations. In this example, the turn-on loop 597A has a positive relationship with the power loop 595, and the turn-off loop 597B has a positive relationship with the power loop 595. Also, shown here is that the gate clamp leads 578C and 588C are mostly isolated from the gate turn-on loop 598A and the gate turn-off loop 598B by the placement of the kelvin emitter lead or emitter sense leads 582 and 592. This illustration shows one embodiment, however, the concepts may be used in other arraignments, for example, the turn-on loop 598A and the turn-off loop 598B may be configured to have a negative relationship with the power loop 595. Also, the turn-on loop 598A and the turn-off loop 598B may have an opposite directional relationship with the power loop 595, whereas the mutual inductive coupling may be different FIGS. 5A-5D have been illustrated and described as IGBTs, however other power devices, such as power MOSFETs, may be manufactured using these concepts by changing references to collector and emitter with drain and source.

Figure 6A:
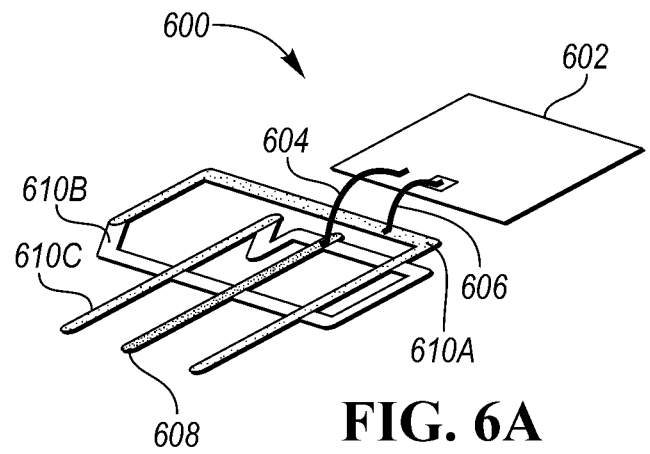
FIG. 6A is a perspective view of a plan layout of an IGBT having dual asymmetric lead length gate terminals.

FIG. 6A is a perspective view of a plan layout of a power device circuit 600 having dual asymmetric lead length gate terminals. The power circuit 600 includes a power device such as an IGBT die 602, an emitter bond wire 604, a gate bond wire 606, an emitter lead 608, and two gate leads. The emitter lead may be a Kelvin emitter lead or it may be a power emitter lead. The two gate leads are a turn-off gate lead (goff1) 610A and a turn-on gate lead (gon1) that comprises three segments, the first segment is shared with the turn-off gate lead (goff1) 610A, the second segment 610B, and a third segment 610C. The segments (610A, 610B, 610C) may be made of the same material or may be a combination of multiple materials such as metals, alloys, composites, or compounds. The segments are typically referred to as a lead frame of the electronic or power device, such as an IGBT lead frame. In this illustration, the gate leads (610A, 610B, 610C) are connected to the IGBT die 602 with a single gate bond wire 606 providing the connection with the gate pad of the power device. In another embodiment, the gate lead may be separate whereas each is connected to the gate pad via a dedicated bond wire. Further, to adjust the coupling coefficient of the turn-off gate lead and the turn-on gate lead, the turn-off gate bond wire and turn-on gate bond wire may be configured with different impedances. An example of the gate leads (610A, 610B, 610C) being made of different materials may include the gate leads 610A and 610C being a metal or alloy, and the second segment 610B being polysilicon.

This illustration may be used to illustrate other power devices, such as power MOSFETs, by changing references to collector and emitter with drain and source.

Figure 6B:
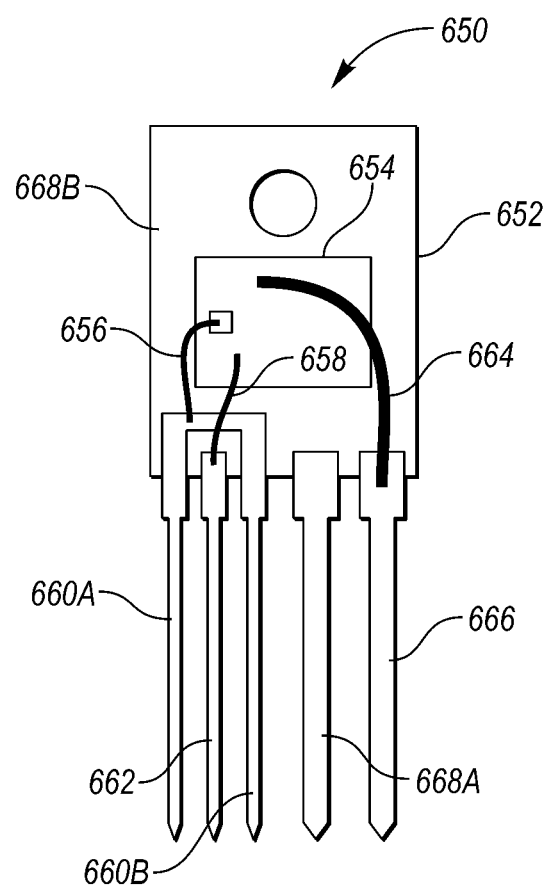
FIG. 6B is an illustration of a plan layout of an IGBT and lead frame having dual gate terminals.

FIG. 6B is an illustration of a plan layout of an IGBT and lead frame having dual gate terminals. For example, this illustration may be a layout of a 5-pin TO-220 package. The discrete component 650 is shown to include a substrate 652 supporting a power device die 654 having a gate emitter bond wire 656 connecting the die 654 with dual gate leads 660A and 660B (also referred to as pins). The discrete component 650 also is shown to include an emitter lead 662 (such as a Kelvin emitter), an emitter bond wire 658, an emitter power bond wire 664, (that may be a ribbon, cable, or clip), a power emitter lead 666, and a power collector (668A and 668B). Concepts in this illustration is may be applied to other device packages including TO-252 (DPAK), TO-263 (D²PAK), TO-220, TO-247.

Further, FIGS. 5B-D, 6A, and 6B were shown and described as dual gate components and modules, however, the concepts may be used in a dual sensing emitter. For example, discrete component 650 may include a substrate 652 supporting a power device die 654 having an emitter bond wire 656 connecting the die 654 with dual sense (or Kelvin) emitter leads 660A and 660B (also referred to as pins). The discrete component 650 also is shown to include a gate lead 662, a gate bond wire 658, an emitter power bond wire 664, (that may be a ribbon, cable, or clip), a power emitter lead 666, and a power collector (668A and 668B).

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated.

While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle comprising:
   an electric machine; and
   a power inverter configured to supply power from a traction battery to the electric machine using a first and second switch configured as a half-bridge, wherein the first switch has
   a first gate,
   a first gate lead coupled with the first gate and having a first inductance, and
   a second gate lead coupled with the first gate and having a second inductance greater than the first inductance.

2. The vehicle of claim 1, wherein the first switch forms
   a power loop defined by a high current flow path from the traction battery through a power inductance associated with the first switch and wire bonding of a package of the first switch, through the electric machine and back to the traction battery,
   a first control loop defined by a first low current flow path from a low voltage supply through the first gate lead of the first switch and back to the low voltage supply, and
   a second control loop defined by a second low current flow path from the low voltage supply through the second gate lead of the first switch and back to the low voltage supply, wherein a first mutual inductance between the power inductance and the first inductance is greater than a second mutual inductance between the power inductance and the second inductance.

3. The vehicle of claim 1, wherein the first switch forms
   a power loop defined by a high current flow path from the traction battery through a power inductance associated with the first switch and wire bonding of a package of the first switch, through the electric machine and back to the traction battery,
   a first control loop defined by a first low current flow path from a low voltage supply through the first gate lead of the first switch and back to the low voltage supply, and
   a second control loop defined by a second low current flow path from the low voltage supply through the second gate lead of the first switch and back to the low voltage supply, wherein a first coupling coefficient between the power inductance and the first inductance is greater than a second coupling coefficient between the power inductance and the second inductance.

4. The vehicle of claim 3, wherein the first coupling coefficient is positive and the second coupling coefficient is negative.

5. The vehicle of claim 1, wherein the power inverter has
   a second gate on the second switch,
   a third gate lead coupled with the second gate having an third inductance, and
   a fourth gate lead coupled with the second gate having a fourth inductance, greater than the third inductance.

6. The vehicle of claim 5, wherein the second switch forms
   a power loop defined by a high current flow path from the traction battery through a power inductance associated with the second switch and wire bonding of a package of the second switch, through the electric machine and back to the traction battery,
   a third control loop defined by a third low current flow path from a low voltage supply through the first gate lead of the first switch and back to the low voltage supply, and
   a fourth control loop defined by a fourth low current flow path from the low voltage supply through the second gate lead of the second switch and back to the low voltage supply, wherein a third mutual inductance between the power inductance and the third inductance is greater than a fourth mutual inductance between the power inductance and the fourth inductance.

* * * * *